United States Patent [19]

Thuen

[11] Patent Number: 4,671,726

[45] Date of Patent: Jun. 9, 1987

[54] CANTILEVERED SOFT LANDING BOAT LOADER FOR SEMICONDUCTOR PROCESSING FURNACES

[75] Inventor: Ted Thuen, Morris Plains, N.J.

[73] Assignee: Breed Corporation, Boonton Township, Morris County, N.J.

[21] Appl. No.: 669,139

[22] Filed: Nov. 7, 1984

[51] Int. Cl.⁴ ............................................. B65G 25/00
[52] U.S. Cl. .................................... 414/182; 248/279; 414/180
[58] Field of Search ............... 414/180, 183, 184, 182; 248/279

[56] References Cited

U.S. PATENT DOCUMENTS

| | | | |
|---|---|---|---|
| 3,272,021 | 9/1966 | Weber | 74/25 |
| 4,008,815 | 2/1977 | Fisk | 414/180 |
| 4,440,538 | 4/1984 | Bowers | 414/183 |
| 4,468,195 | 8/1984 | Sasaki et al. | 414/180 X |

Primary Examiner—L. J. Paperner
Assistant Examiner—Stuart J. Millman
Attorney, Agent, or Firm—Kane, Dalsimer, Kane, Sullivan and Kurucz

[57] ABSTRACT

A cantilevered, soft landing boat loading system for semiconductor processing furnaces includes an alignment mechanism, a paddle, and a boat loader. The alignment mechanism includes five handles for five degrees of freedom. The boat loader is supported from a vertical plane.

13 Claims, 8 Drawing Figures

CANTILEVERED SOFT LANDING BOAT LOADER FOR SEMICONDUCTOR PROCESSING FURNACES

BACKGROUND OF THE INVENTION

The production and manufacture of semiconductors is a complex and meticulous process. One area in which particular care and precision are required is the heating in furnaces for vapor deposition, diffusion and other processes. Specific areas of concern are particulate count and the alignment of the silicon wafers in the process tubes of the furnace.

In the existing systems, friction is created between the wafer sled or boat and the inner surface of the process tube. This friction causes multiple problems. The most significant problem is that the friction creates quartz dust which then increases the particulate count at the diffusion stage. Since the wafer's characteristics are directly related to their purity, attaining a lower particulate count will directly improve the quality of the wafer specifications. If the level of dust from friction is high, then the wafers will be contaminated and the yield will drop dramatically. Additional problems incurred include more time being required for cleaning the process tube and therefore a decrease in production capability, downtime of the furnace is increased and wear on the tubes is increased.

The presently existing retraction systems use two rods lying in a horizontal plane to support the carriage which in turn holds the paddle containing the wafers. All of the supporting mechanism and therefore, the adjusting mechanism, is underneath the paddle. Adjustments are therefore difficult to get at and usually require special tools.

The mechanism used to raise and lower the paddle, is typically a servo motor located above the supporting rods, but below the paddle. In these systems, the paddle is driven into the furnace to its final position and then lowered by use of the Servo motor. When it comes time to remove the boats, the process is repeated. This system is unduly complicated in that it requires an additional motor and controlling system. In addition, when the boats rest on the tube in the furnace, it is quite common for these boats to stick slightly. When the servo motor lifts the paddle up, there is a sudden release of energy in the vertical direction when the boat becomes unstuck from the furnace tube. This sudden release of energy can damage the silicon wafers and even in some cases, knock them out of their resting position in the boat.

SUMMARY OF THE INVENTION

The invention disclosed herein has, as its principal object, the furnishing of a novel device for aligning the paddle with the furnace tube.

Another object of this invention is to provide an improved method of soft landing the paddle inside the tube of the furnace.

A further object of the invention is to provide a toggle system which permits the removal of the paddle from the furnace in an easy manner.

DETAILED DESCRIPTION OF THE INVENTION

Figure 1:
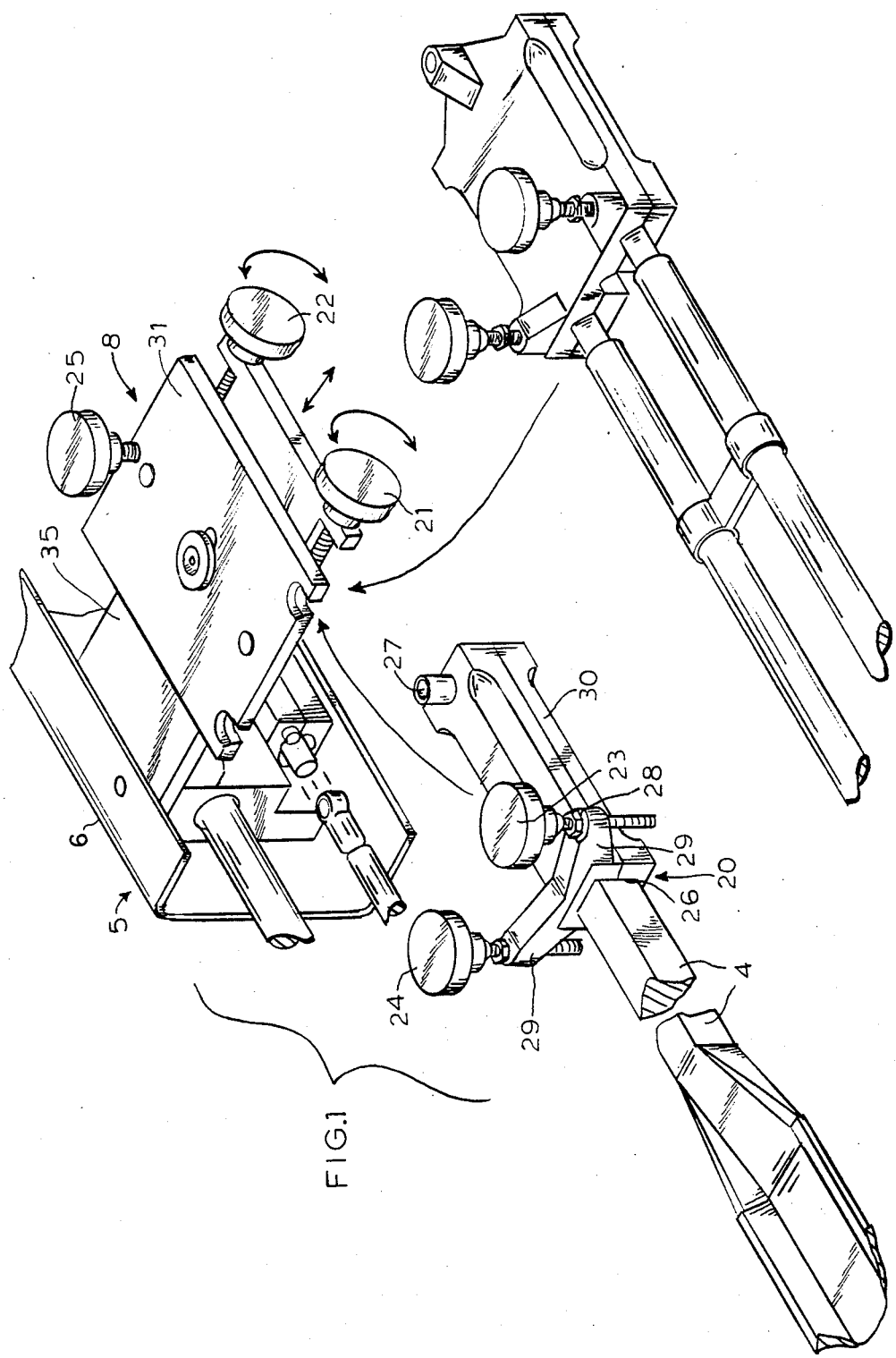
FIG. 1 is a perspective view of the cantilevered, drop-off boat loader assembly, the alignment mechanism with the paddle clamp detached and a paddle.
Figure 2:
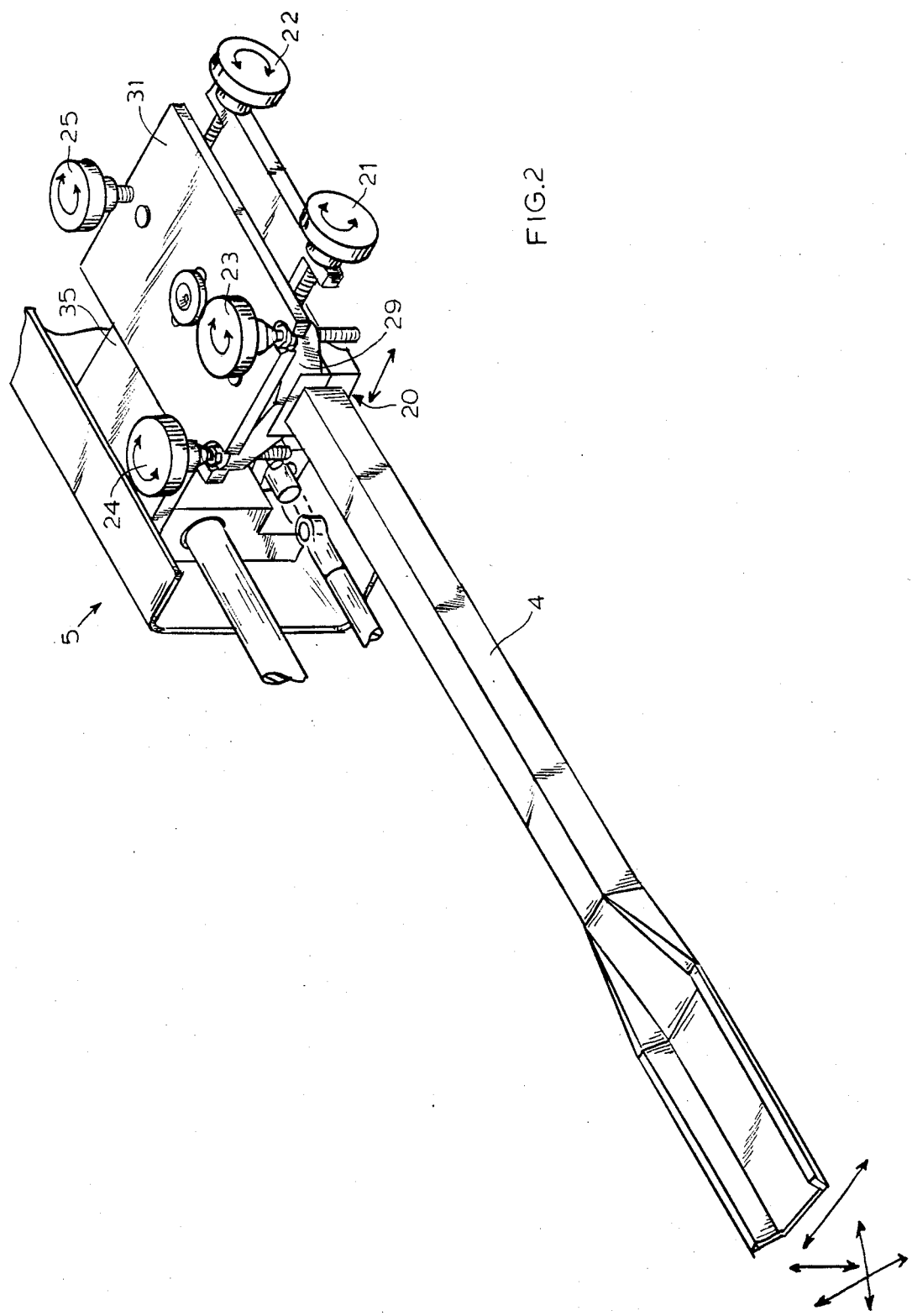
FIG. 2 is a perspective view of the cantilevered drop-off boat loader assembly, the alignment mechanism with one embodiment of a paddle clamp attached.

In FIG. 1, an embodiment of the invention is shown, comprising cantilevered boat loader 5 mounted in a stationary housing 6, alignment mechanism 8 and a paddle 4.

Figure 3:
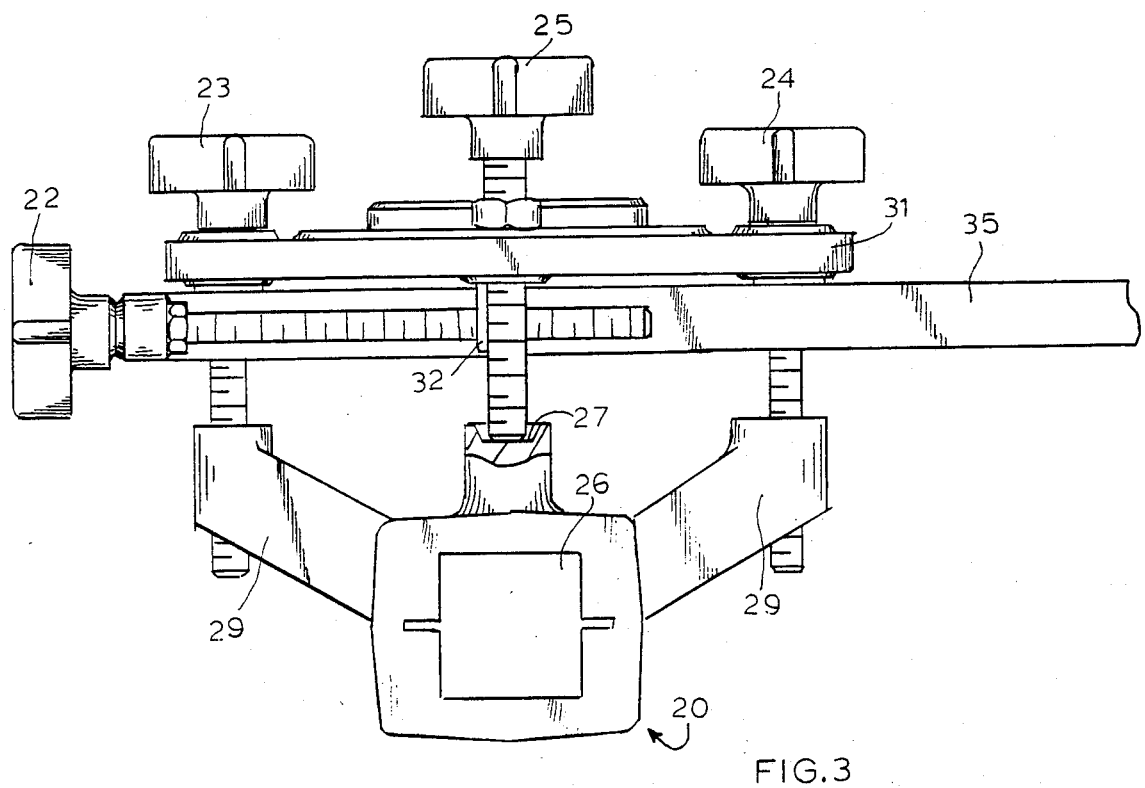
FIG. 3 is a fragmentary longitudinal sectional view of the alignment mechanism and the paddle clamp.
Figure 4:
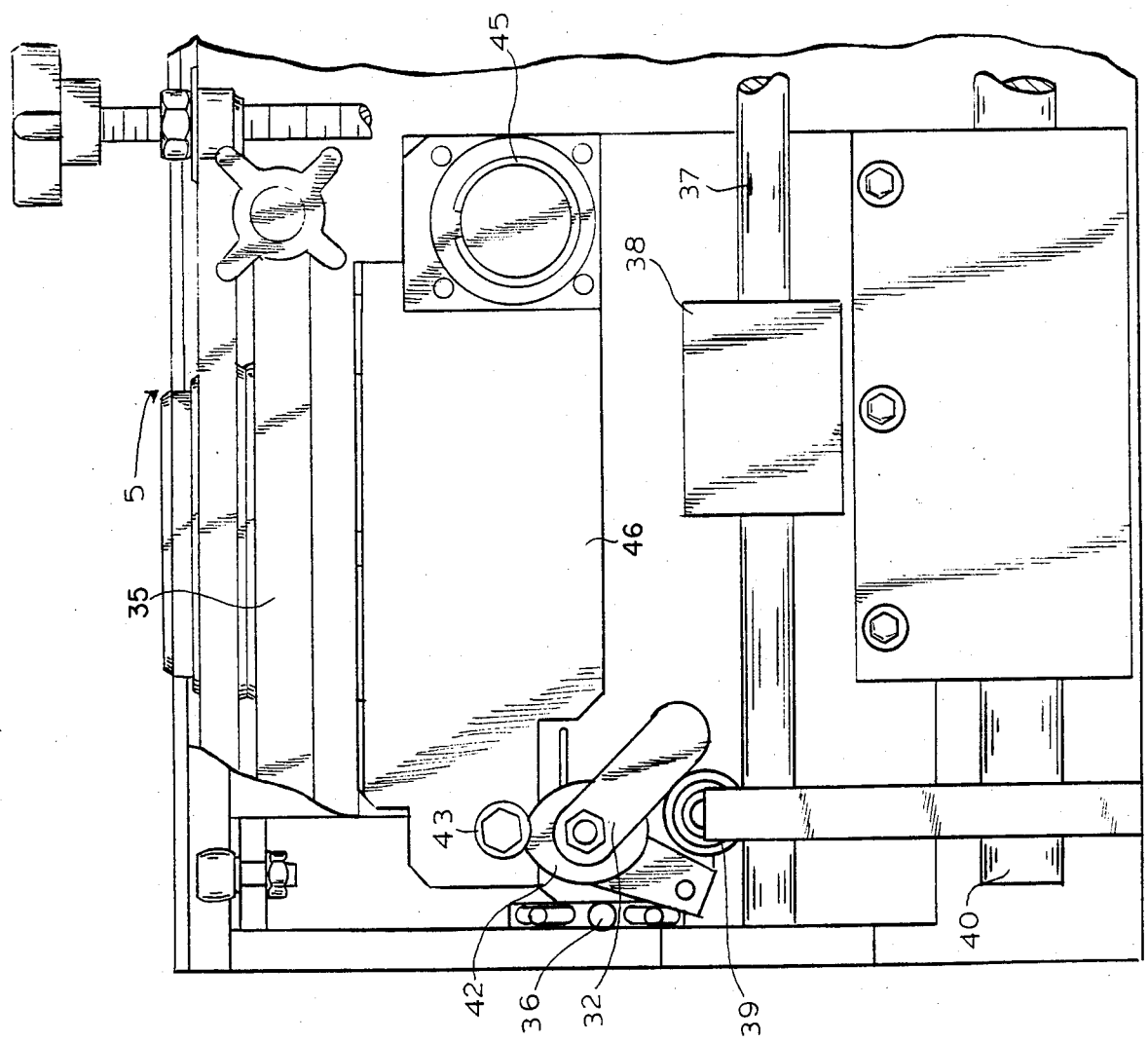
FIG. 4 is a fragmentary longitudinal view of one embodiment of the cantilevered drop-off boat loader.
Figure 5:
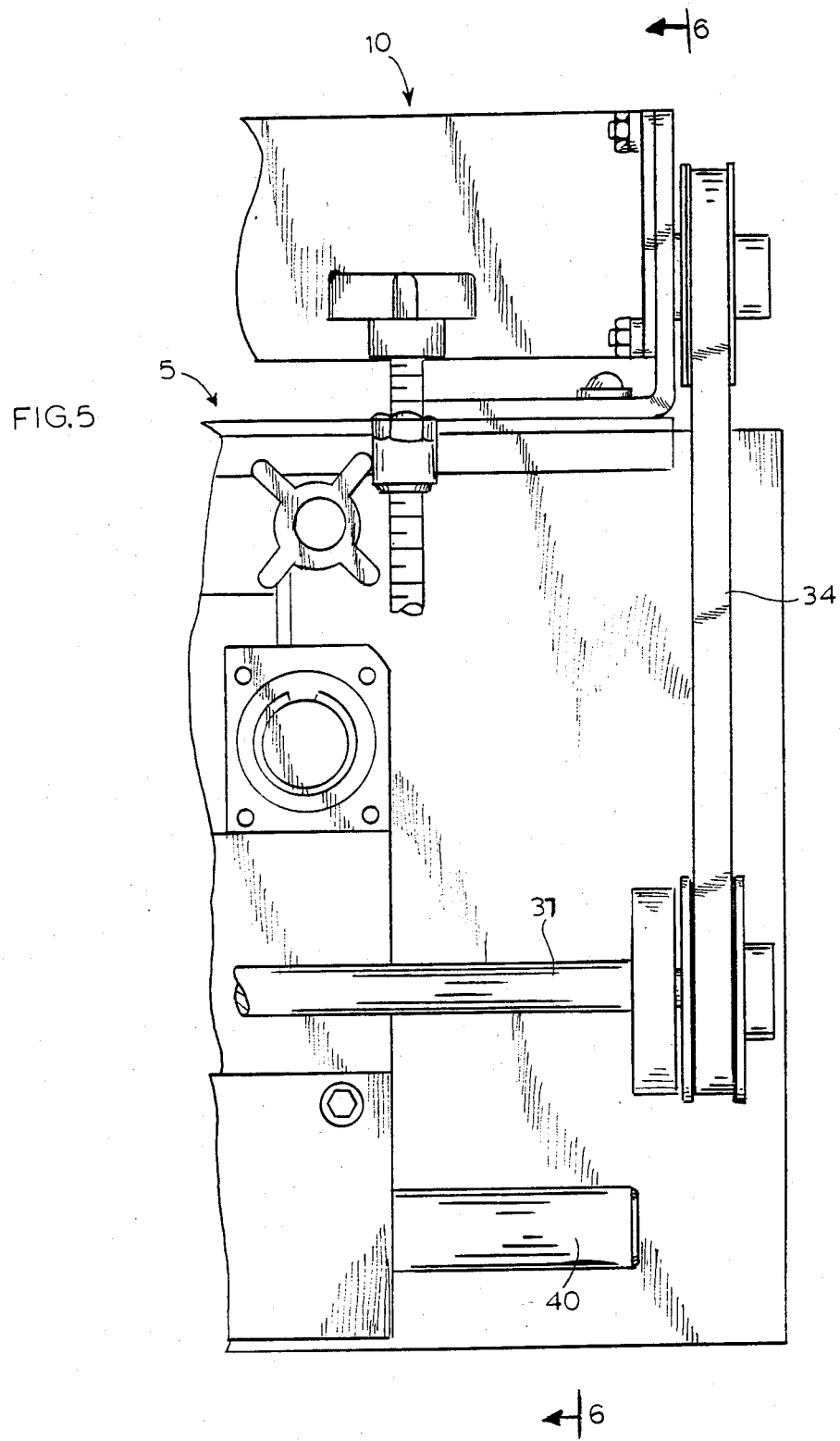
FIG. 5 is a fragmentary longitudinal view of the drive mechanism of the cantilevered drop-off boat loader.

The alignment mechanism shown in FIG. 1 consists of five (5) handles 21, 22, 23, 24, 25, plate 31, paddle clamps 20 and cantilever 35. Each of the handles has a knob and threaded rod. This mechanism provides five degrees of freedom of adjustment of the paddle, to permit accurate alignment of the paddle with the bore of the oven tube. Paddle clamp 20 consists of a main body 30, two arms 29 which project outwardly in an upward angular direction, and circular ring 27 defining a cavity on the upper surface of the main body 30 at the opposite end of arms 29. Arms 29 have vertical threaded holes 28 at the outer ends of each arm. Handles 23 and 24 are screwed into holes 28 in arms 29. Referring now to FIGS. 1 and 3, handle 25 is screwed through a hole at one end of plate 31 which is centrally located on that side. The opposing side has two recesses 33 on its edge. In order to attach paddle clamp 20 to plate 31, handles 23 and 24 fit into recesses 33 in plate 31 and the tip of handle 25 fits into the cavity formed by circular ring 27. Handles 21 and 22 are threaded through the end on cantilever 35 and then pass on through threaded holes in projections 32 which are attached to plate 31. Handles 23, 24 and 25 work in the vertical direction and handles 21 and 22 work in the horizontal direction. By rotating handles 21 and 22 together in the same direction, the paddle 4 can be moved toward or away from the operator. By rotating handle 21 and 22 in opposite directions the paddle 4 can be made to rotate about a vertical axis. In a like manner, rotating handles 23, 24 and 25 can cause the paddle 4 to rotate about either of the horizontal axis or the entire paddle 4 can be raised or lowered.

As a result of this design, paddle clamp 20 and handles 23 and 24 along with the paddle 4 can be easily removed from the remainder of the mechanism. As a result, cleaning of the paddles as they get dirty is facilitated. Also these parts can be easily lifted off the rest of the alignment mechanism and replaced without having to readjust or realign the paddle 4. Similarly, many different paddles can be taken off and placed on the machine without the need for realignment.

Figure 6:
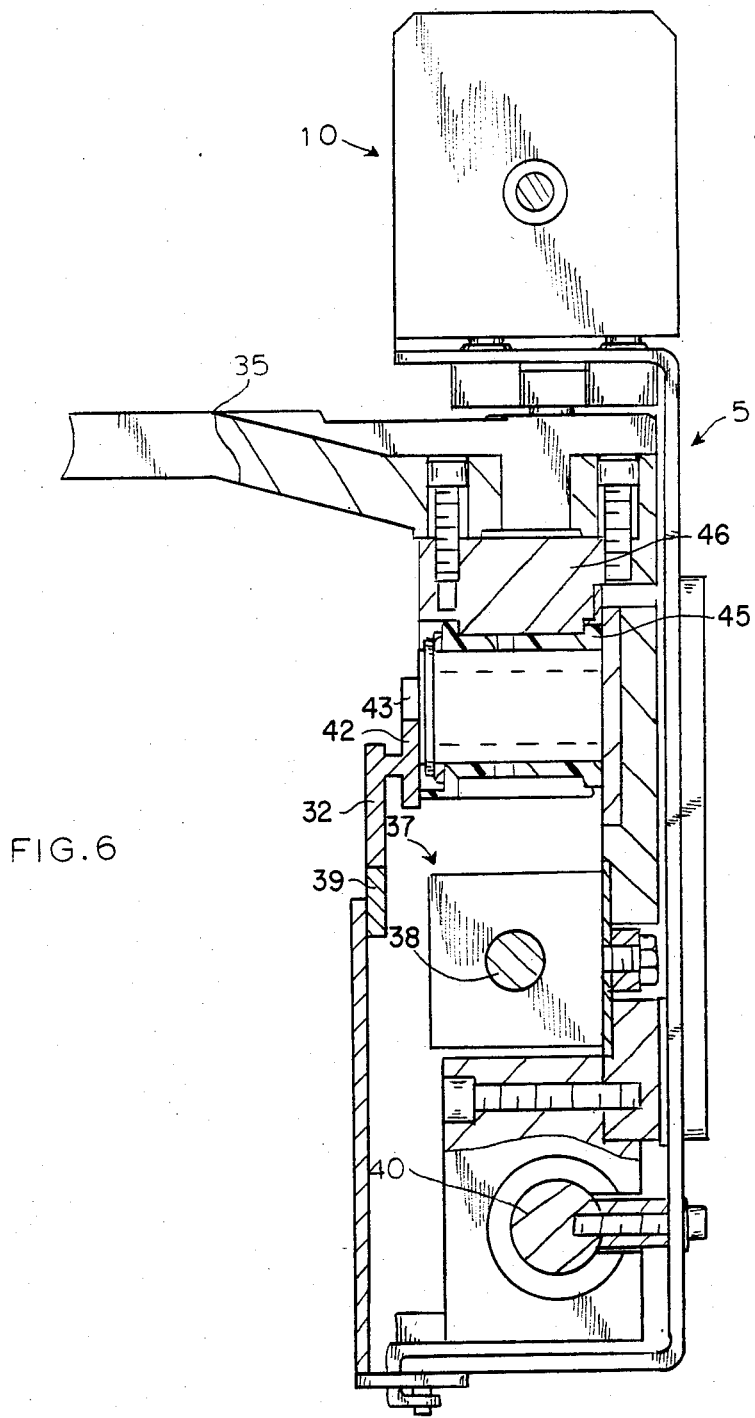
FIG. 6 is a longitudinal sectional view of the cantilevered drop-off boat loader taken along line 6—6 illustrating connection of the soft landing mechanism of FIG. 4 to the alignment mechanism.

One end of cantilever 35 is attached to the alignment mechanism 8, the other end is connected to boat loader 5 as seen in FIG. 6. This boat loader 5 drives the paddle 4 and alignment mechanism 8 to the left and the paddle 4 thus enters the furnace carrying with it the boats which contain the silicon wafers. Boat loader 5 is driven by gear motor 10. When gear motor 10 is turned on it activates belt 34 which drives shaft 37. As shaft 37 rotates the rohlix actuator 38 moves to the left and drives the boat loader to the left too. A rohlix actuator is a device for translating rotational motion into lateral motion as described in U.S. Pat. No. 3,272,021. During this process the boat loader is kept on track by guide shaft 40 which acts to insure that the boat loader doesn't lose alignment.

As the boat loader 5 is moving to the left lever 32 is resting on lever stop 36. When the boat loder 5 nears the end of shaft 37 the lever 32 is engaged by lever actuator roller bearing 39. This lever actuated roller bearing 39 is held in a fixed position on the main support structure. As the boat loader 5 continues moving left, the roller bearing causes lever 32 to rotate counter-clockwise which in turn causes cam 42 to rotate 90°. Since cam 42 is elliptical in shape the 90° rotation causes roller bearing 43, which is in contact with cam 42, to drop a fraction of an inch. This now permits member 46 to rotate about bearing 45, and thus the boat loader 5 to rotate about bearing 45.

Paddle 4 has a long rectangular end which fits into the corresponding rectangular orifice 26 in paddle clamp 4. The opposite end of paddle 4 holds the wafer boats, and is shaped like a trough with its outer end open.

As the boat loader 5 rotates about bearing 45 the paddle 4 releases the boat carrying the silicon wafers which then rests on the bottom of the furnace tube inside the furnace.

When the gear motor 10 is now reversed, the boat loader 5 and paddle 4 travel back to the right and the lever 32 returns to the lever stop 36. The cam 42 does not rotate with the lever 32, however, because lever 32 is fitted with a ratchet mechanism. When lever 32 is urged in a counterclockwise direction the pawltype ratchet is engaged and cam 42 is rotated. However, when lever 32 rotates in a clockwise direction the ratchet mechanism is disengaged and the lever 32 rotates without rotating cam 42. Thus the paddle 4 does not come back into contact with the boats with the silicon wafers in the furnace.

Once processing is completed and the wafers are to be removed, the gear motor 10 is once again engaged to drive the boat loader to the left. Near the end of the travel, the lever 32 once again contacts the lever actuator roller bearing 39 and rotates counter-clockwise 90°. This once again causes the cam 42 to rotate 90°, this time a point at its greatest radius comes in contact with roller bearing 43. This causes the assembly to rotate clockwise about bearing 45 a fraction of an inch and lift the boat carrying the silicon wafers up off the furnace tube. Now, when the motor is reversed the boat loader 5 and paddle 4 withdraw the boat carrying the silicon wafers from the furnace.

This system herein described causes the boat to slide slightly on the furnace tube. Thus, the boat is released from the furnace tube primarily in a horizontal direction rather than vertical. This does not damage the silicon wafers nor jar them from their supporting locations.

Figures 7, 8:
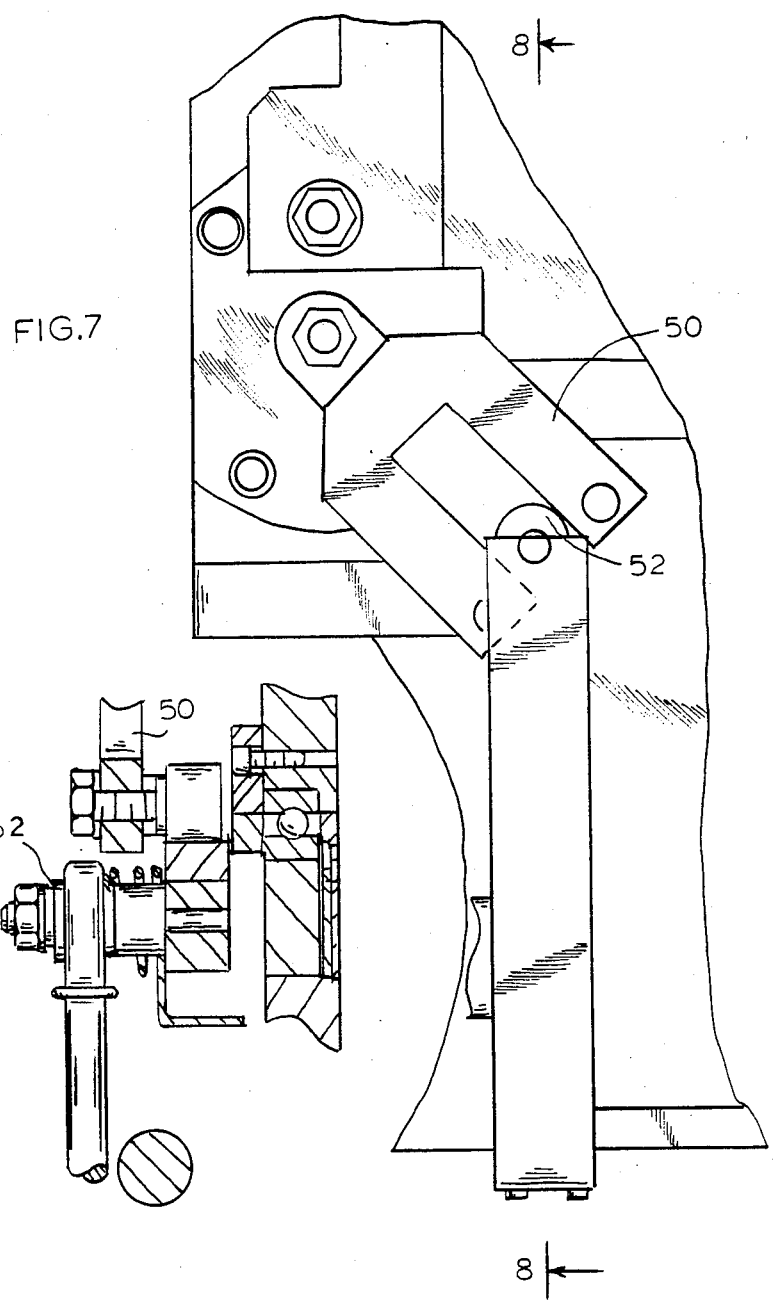
FIG. 7 is a fragmentary longitudinal view of an alternate embodiment of the cantilevered drop-off boat loader.
FIG. 8 is a longitudinal sectional view of the alternate embodiment of the cantilevered drop-off boat loader taken along line 8—8.

An alternate embodiment is depicted in FIGS. 7 and 8 in which the lever 32 is replaced by a fork lever 50. In this embodiment the boats are soft landed in the same manner as in the previous embodiment. However, in this case, the paddle 4 is not removed from the furnace while the processing takes place, thus there is no need for the ratchet mechanism described above. In this case, a fork lever 50 engages the lever actuator roller bearing 52 in a similar manner as in the previous embodiment and lowers the boats onto the bottom of the furnace tubes. Upon removal, the fork lever 50 is rotated clockwise, which now raises the front of the carriage mechanism through the same cam roller bearing arrangement in the previous embodiment and once again lifts the boat in such a manner that unsticking the boat occurs primarily in the horizontal direction.

Thus among others, the several objects in this invention, as specifically aforenoted, are achieved. Obviously, numerous changes might be resorted to without departing from the spirit of the invention as defined by the claims.

What is claimed is:

1. A soft landing boat loading system for workpiece processing in furnaces comprising:
    a frame;
    a loading mechanismin mechanical communication with the frame and laterally movable with respect to the frame in a forward loading direction and a rearward unloading direction, the loading mechanism having a carrying member for placing workpieces into a furnace and for removing workpieces from a furnace;
    a drive means in mechanical communiation with the loading mechanism for driving the loading mechanism in the lateral forward and rearward directions and for driving the carrying member in vertical lifting and lowering directions, the loading mechanism having a lever which is actuated by a stationary actuator in order to rotate a cam so that the drive means drives the carrying member in the vertical lifting and lowering directions in response to lateral motion of the loading mechanism.

2. A soft landing boat loading system according to claim 1 wherein the drive means comprises a motor, a shaft rotatably driven by the motor, and a converting means mounted on the shaft for converting rotational motion into lateral motion.

3. A soft landing boat according to claim 2 wherein the drive means further comprises a lifting and lowering means comprising a rotatable member rotatably affixed on one end to a wall of the loading mechanism and having a cam follower laterally spaced from the end, the cam follower being actuable in response to lateral movement of the loading mechanism.

4. A soft landing boat according to claim 3 wherein the lifting and lowering means further comprises a first cam affixed to a lever shaft for driving the cam follower, the lever shaft affixed on one end to the wall, and on the other end to a lever, and the lever having a pawltype ratchet mechanism, wherein the lever is actuable in response to a second cam affixed to the frame.

5. A soft landing boat loader for processing workpieces in a furnace comprising:
    a loading mechanism movable in a forward loading and a rearward unloading direction having a carrying means comprising a shaft and a carrying member for carrying a workpiece and having an alignment system for aligning the carrying means with a furnace opening, the alignment system having first adjustment means for adjusting the orientation of the carrying means about a vertical axis, second adjustment means for adjusting the orientation of the carrying means in a vertical direction about a horizontal axis perpendicular to the shaft and a third adjustment means for adjusting the orientation of the carrying means about the axis of the shaft.

6. A soft landing boat loader according to claim 5 wherein the carrying means is supported from above by a supporting means affixed to the loading mechanism.

7. A soft landing boat loader according to claim 5 wherein the support means comprises an upper and a lower plate and wherein the second and third adjustment means adjust the plates relative to one another to align the carrying means.

8. A soft landing boat according to claim 7 further comprising a clamping means supported by the plates, the clamping means being adapted to receive the shaft of the carrying means.

9. A soft landing boat according to claim 8 wherein the first, second and third adjustment means comprise rotating means, each rotating means having a threaded shaft affixed to a rotatable handle.

10. A soft landing boat loader according to claim 9 wherein the first adjusting means comprises a pair of rotating means, the handles located on a side of the lower plate and the threaded shafts extending into the lower plate.

11. A soft landing boat according to claim 9 wherein the second adjustment means comprises a first rotating means mounted on a forward portion of the upper plate and at least one second rotating means mounted on a rearward portion of the upper plate, the handles being located above the upper plate and the threaded shafts extending through both the upper and lower plates and into the clamping means, the threaded shafts being in threaded communication with the upper plate, lower plate and clamping means.

12. A soft landing boat according to claim 9 wherein the third adjustment means comprises a first rotatable means mounted on the upper plate and located on one side of the shaft and a second rotatable means mounted on the upper plate and located on the other side of the shaft.

13. A soft landing boat loader for processing workpieces in a furnace comprising:

a loading mechanism movable in a forward loading and a rearward unloading direction having a carrying means comprising a shaft and a carrying member for carrying a workpiece, the carrying member being supported from above by a supporting means affixed to the loading mechanism and having an alignment system for aligning the carrying means with a furnace opening, the alignment system having first adjustment means for adjusting the orientation of the carrying means about a vertical axis and second adjustment means for adjusting the orientation of the carrying means in a vertical direction about a horizontal axis perpendicular to the shaft wherein the support means comprises an upper and a lower plate and wherein the second and third adjustment means adjust the plates relative to one another to align the carrying means.

* * * * *